(12) United States Patent
Zhang et al.

(10) Patent No.: US 10,254,162 B2
(45) Date of Patent: Apr. 9, 2019

(54) OPTICAL MODULE

(71) Applicants: HISENSE BROADBAND MULTIMEDIA TECHNOLOGIES CO., LTD, Qingdao (CN); HISENSE BROADBAND MULTIMEDIA TECHNOLOGIES, LTD., Road Town (VG)

(72) Inventors: Qiang Zhang, Qingdao (CN); Qisheng Zhao, Qingdao (CN)

(73) Assignees: HISENSE BROADBAND MULTIMEDIA TECHNOLOGIES CO., LTD., Shandong (CN); HISENSE BROADBAND MULTIMEDIA TECHNOLOGIES LTD., Tortola (VG)

( * ) Notice: Subject to any disclaimer, the term of this patent is extended or adjusted under 35 U.S.C. 154(b) by 194 days.

(21) Appl. No.: 15/394,659

(22) Filed: Dec. 29, 2016

(65) Prior Publication Data

US 2018/0073921 A1 Mar. 15, 2018

(30) Foreign Application Priority Data

Sep. 9, 2016 (CN) .......................... 2016 1 0813775

(51) Int. Cl.
  *G01J 1/44* (2006.01)
  *H01L 31/103* (2006.01)
  (Continued)

(52) U.S. Cl.
  CPC .............. *G01J 1/44* (2013.01); *G02B 6/4274* (2013.01); *G02B 6/4293* (2013.01);
  (Continued)

(58) Field of Classification Search
  CPC .................. G01J 1/44; G01J 2001/446; G01J 2001/4406; H01L 31/107; H01L 31/103;
  (Continued)

(56) References Cited

U.S. PATENT DOCUMENTS

| 6,351,309 B1* | 2/2002 | Bomse .................. G01J 3/4338 250/343 |
| 6,356,599 B1* | 3/2002 | Lee ......................... H04M 3/00 329/307 |
| 2011/0276191 A1 | 11/2011 | Zushi et al. .................. 700/293 |

FOREIGN PATENT DOCUMENTS

| CN | 101594184 A | 12/2009 |
| CN | 101854212 A | 10/2010 |
| CN | 203086479 U | 7/2013 |

OTHER PUBLICATIONS

The Chinese First Examination Report of corresponding Chinese patent application No. 201610813775.X, dated Dec. 5, 2017.

* cited by examiner

*Primary Examiner* — Seung C Sohn
(74) *Attorney, Agent, or Firm* — J.C. Patents

(57) ABSTRACT

The present disclosure provides an optical module comprising: a photoelectric conversion unit, a first demodulation circuit, and a second demodulation circuit; the first demodulation circuit and the second demodulation circuit are respectively connected to the photoelectric conversion unit; the photoelectric conversion unit is configured to convert the received optical signal into an electrical signal; the first demodulation circuit is configured to demodulate an electrical signal converted by the photoelectric conversion unit and generate a high-frequency electrical signal; the second demodulation circuit is configured to demodulate an electrical signal converted by the photoelectric conversion unit and generate a low-frequency electrical signal.

13 Claims, 3 Drawing Sheets

(51) Int. Cl.
    *G02B 6/42*      (2006.01)
    *H01L 31/107*    (2006.01)
    *H04B 10/69*     (2013.01)
(52) U.S. Cl.
    CPC .......... *H01L 31/103* (2013.01); *H01L 31/107* (2013.01); *G01J 2001/446* (2013.01); *G01J 2001/4406* (2013.01); *H04B 10/6911* (2013.01)
(58) Field of Classification Search
    CPC . G02B 6/4293; G02B 6/4274; H04B 10/6911
    USPC .............................. 250/214 A, 214.1; 398/24
    See application file for complete search history.

OPTICAL MODULE

CROSS-REFERENCE TO RELATED APPLICATIONS

This application claims priority to Chinese Patent Application No. 201610813775.X, filed on Sep. 9, 2016 and entitled "Optical Module", the content of which is incorporated by reference in its entirety.

TECHNICAL FIELD

The present disclosure relates to electronic technology and, more particularly, to an optical module.

BACKGROUND

With the development of optical fiber communication technology, in the field of optical fiber communication, it is required to load low-frequency signal on the original high-speed service channel. For example, the International Organization for Standardization, FSAN, proposed to add an Auxiliary Management and Control Channel (AMCC) to a point-to-point dense wavelength division multiplexing passive optical network. The transmission rate of AMCC is generally below 100 Kbit/s, i.e., belonging to low-frequency signal. Therefore, PTP WDM PON network is required to bear both the original high-speed service signal and low-frequency signal such as AMCC.

In the PTP WDM PON network, the optical signal is received and transmitted by an optical module. However, in the prior art, the optical module can only receive and transmit the high-frequency digital service signal, but cannot receive or transmit the low-frequency signal.

Therefore, the optical module in the prior art cannot meet the requirement of bearing both the high-frequency signal and the low-frequency signal simultaneously.

SUMMARY

The present application provides an optical module including a photoelectric conversion unit, a first demodulation circuit, and a second demodulation circuit;

the first demodulation circuit and the second demodulation circuit are respectively connected to the photoelectric conversion unit;

the photoelectric conversion unit is configured to convert the received optical signal into an electrical signal;

the first demodulation circuit is configured to demodulate an electrical signal converted by the photoelectric conversion unit and generate a high-frequency electrical signal;

the second demodulation circuit is configured to demodulate the electrical signal converted by the photoelectric conversion unit and generate a low-frequency electrical signal.

The optical module provided by the present application includes the photoelectric conversion unit, the first demodulation circuit, and the second demodulation circuit. After the photoelectric conversion unit converts the received optical signal into an electrical signal, the first demodulation circuit and the second demodulation circuit demodulate the electrical signal and generate a high-frequency and a low-frequency electrical signal respectively, and output the high-frequency and the low-frequency electrical signal to the subsequent devices for use. So that the optical module can bear both the high-frequency signal and the low-frequency signal to meet the requirements of bearing both high-frequency and low-frequency signal in the practical application.

In addition, the first demodulation circuit and the second demodulation circuit in the optical module provided in the present application are independent from each other, that is, a circuit that demodulates low-frequency signal is added on the basis of the original circuit that demodulates high-frequency signal circuit, therefore it is possible to ensure that the original demodulation for high-frequency signal is not affected and guarantee a good sensitivity of the optical module.

BRIEF DESCRIPTION OF DRAWINGS

A brief introduction will be given hereinafter to the accompany drawings which will be used in the description of the present application or related art in order to explain the technical solutions of the present application or related art more clearly. Apparently, the drawings in the description below are merely illustrating some embodiments of the present application. Those skilled in the art may obtain other drawings according to these drawings without paying any creative labor.

DESCRIPTION OF EMBODIMENTS

In order to make the purposes, the technical solutions and the advantages of the present application clearer, a clear and full description will be given to the technical solution of the present application with reference to the accompanying drawings. Obviously, the described embodiments are only part of the embodiments of the present application, rather than all of them. According to the embodiments of the present application, all of the other embodiments obtained by those with ordinary skill in the art without consuming any creative work fall within the protection scope of the present application.

Figure 1:
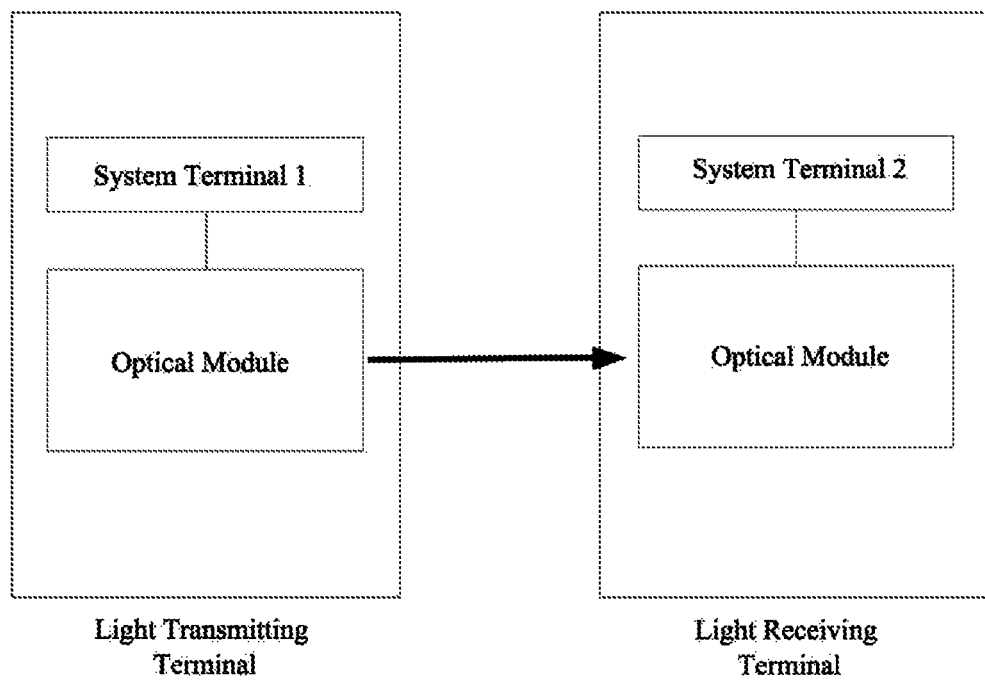
FIG. 1 is a schematic diagram of optical communication interaction of optical modules.

An optical module is a kind of photoelectric conversion device, and the optical communication using optical modules is an interactive communication. FIG. 1 is a schematic diagram of optical communication interaction of optical modules. As shown in FIG. 1, at a light transmitting terminal, an optical module is connected to a system terminal 1, such as a switch, receives an electrical signal from the system terminal 1, and converts the electrical signal into an optical signal for output, and inputs the optical signal into an optical waveguide, such as an optical fiber, to realize information transmitting. At a light receiving terminal, an optical module is connected to a system terminal 2, such as a switch, receives the optical signal from the transmitting terminal, converts the optical signal into an electrical signal and outputs it to the system terminal 2. In this case, the system terminal 1 and the system terminal 2 may include a switch, an optical network terminal set-top box, an optical line terminal set-top box, or the like.

The present application relates mainly to the optical module of the light receiving terminal, that is, a structure in which the optical module receives, converts and demodulates optical signal.

Figure 2:
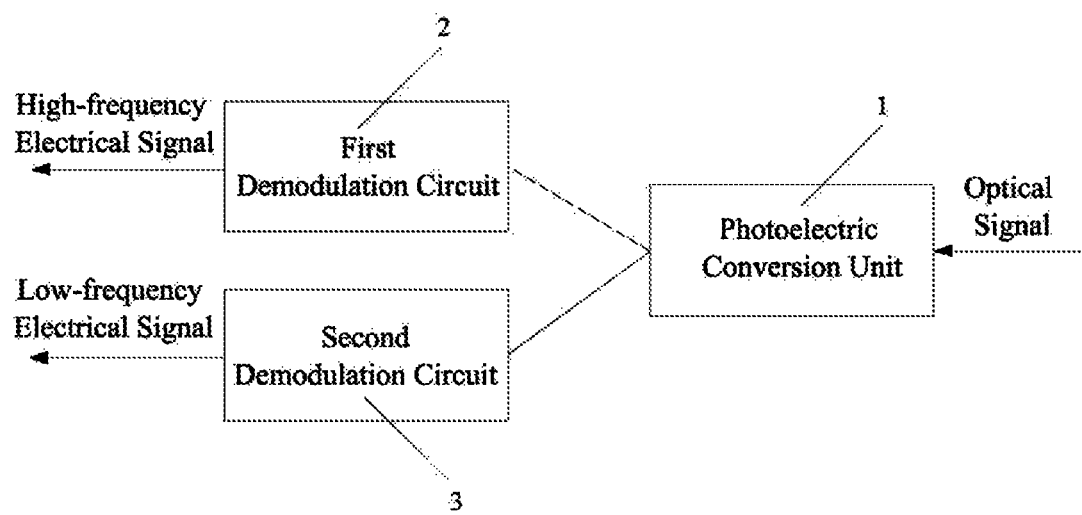
FIG. 2 is a structural diagram of an optical module according to some embodiments of the present application.

FIG. 2 is a structural diagram of an optical module according to some embodiments of the present application. As shown in FIG. 2, an optical module includes a photoelectric conversion unit 1, a first demodulation circuit 2, and a second demodulation circuit 3.

The first demodulation circuit 2 and the second demodulation circuit 3 are respectively connected to the photoelectric conversion unit 1.

In this case, the photoelectric conversion unit 1 is configured to convert the received optical signal into an electrical signal.

The photoelectric conversion unit 1 receives the optical signal transmitted from the Optical Line Terminal (OLT). The optical signal transmitted by the OLT may be a subcarrier modulated optical signal formed by the high-frequency signal and the low-frequency signal. The optical signal may be demodulated by the optical module to get a high-frequency signal and a low-frequency electrical signal.

The optical module receives the optical signal transmitted by the OLT through the photoelectric conversion unit 1. After the receiving, the optical module 1 converts the optical signal into an electrical signal. The electrical signal is a current signal. The photoelectric conversion unit 1 uses the photoelectric effect to convert the light with optical power changes into a current signal with current value changes which will then be demodulated by a subsequent circuit.

The first demodulation circuit 2 is configured to demodulate an electrical signal converted by the photoelectric conversion unit 1 and generate a high-frequency electrical signal.

The second demodulation circuit 3 is configured to demodulate an electrical signal converted by the photoelectric conversion unit 1 and generate a low-frequency electrical signal.

The first demodulation circuit 2 and the second demodulation circuit 3 are two circuits which are independent from each other and are connected to the photoelectric conversion unit 1, respectively. The first demodulation circuit 2 generates a high-frequency electrical signal through an internal device, and the second demodulation circuit 3 generates a low-frequency electrical signal through an internal device. In this case, the high-frequency electrical signal refers to a high-speed data service signal, the rate of which can reach 10 Gbps, while the low-frequency electrical signal refers to the signal can support AMCC function, the rate of which can be less than 100 kbps.

Optionally, the high-frequency electrical signal generated by the first demodulation circuit 2 through the internal device may be a digital signal or an analog signal, and may be processed by the back-end device that receives the high-frequency electrical signal as necessary. For example, if the high-frequency electrical signal is a digital signal and the back-end device that receives the high-frequency electrical signal needs to use an analog signal, then the back-end device may first perform digital-to-analogue conversion. If the high-frequency electrical signal is a digital signal and the back-end device that receives the high-frequency electrical signal also needs to use a digital signal, then the back-end device can directly use the digital signal. The low-frequency electrical signal generated by the second demodulation circuit 3 through the internal device may be an AMCC signal, that is, a signal that can support AMCC function, in particular, such as a digital signal, a square signal, a saw-tooth signal, an analog signal or the like.

It should be noted that the present application does not limit the type of the generated low-frequency electrical signal. Any type of the low-frequency electrical signal that differs from the high-frequency digital signal, can be demodulated by the optical module provided by the present application and be output.

Optionally, the foregoing photoelectric conversion unit 1 can be an avalanche photo diode (APD) or a PIN photo diode.

In the embodiment of the present application, the optical module includes the photoelectric conversion unit, the first demodulation circuit, and the second demodulation circuit. After the photoelectric conversion unit converts the received optical signal into the electrical signal, the first demodulation circuit and the second demodulation circuit demodulate the electrical signal and generate a high-frequency signal and a low-frequency electrical signal respectively, and output them to the subsequent device for use. So that the optical module can bear both the high-frequency signal and the low-frequency signal, which meets the requirements of bearing both high-frequency signal and low-frequency signal in the practical application.

In addition, in the embodiments of the present application, the first demodulation circuit and the second demodulation circuit are independent from each other. That is, a circuit for demodulating the low-frequency signal is added on the basis of the original circuit for demodulating high-frequency signal circuit, therefore it is possible to ensure that the original demodulation for high-frequency signal is not affected and guarantee a good sensitivity of optical module.

Figure 3:
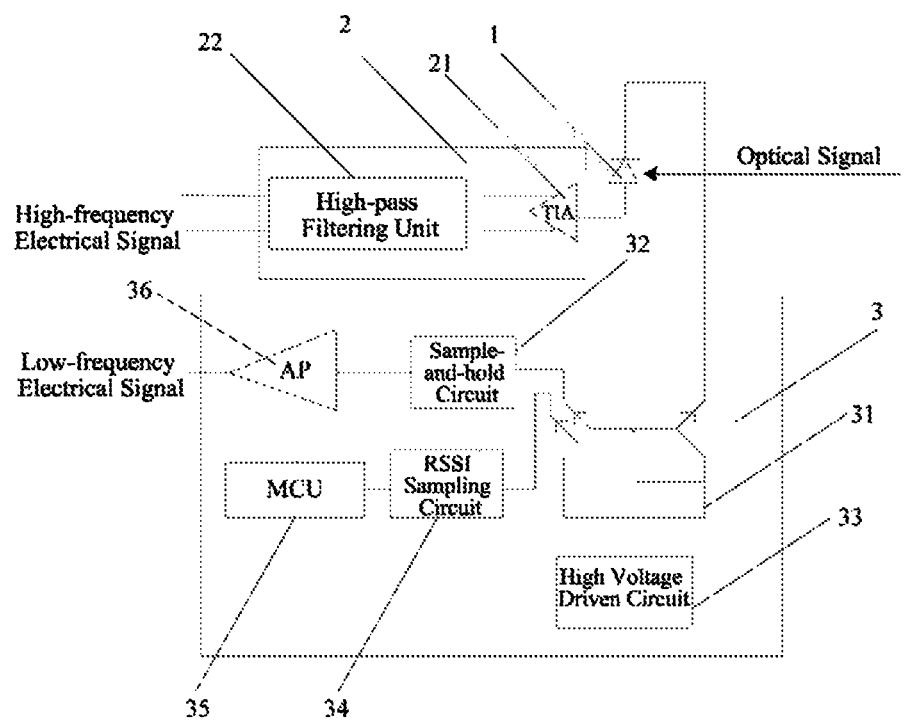
FIG. 3 is a structural diagram of another optical module according to some embodiments of the present application.

FIG. 3 is a structural diagram of another optical module according to some embodiments of the present application. As shown in FIG. 3, the first demodulation circuit 2 includes a transimpedance amplifier 21 and a high-pass filtering unit 22. In this case, the transimpedance amplifier 21 is connected to the photoelectric conversion unit 1, and the high-pass filtering unit 22 is connected to the transimpedance amplifier 21.

The transimpedance amplifier 21 is configured to convert a current signal output from the photoelectric conversion unit 1 into a voltage signal for output, while the high-pass filtering unit 22 is configured to perform high-pass filtering on the voltage signal output from the transimpedance amplifier 21.

The transimpedance amplifier 21 can not only convert the current signal output by the photoelectric conversion unit 1 into a voltage signal, but also can perform the preliminary amplification on the converted voltage signal.

The high-pass filtering unit 22 is mainly used for performing high-pass filtering on the voltage signal output from the transimpedance amplifier 21.

Figure 4:
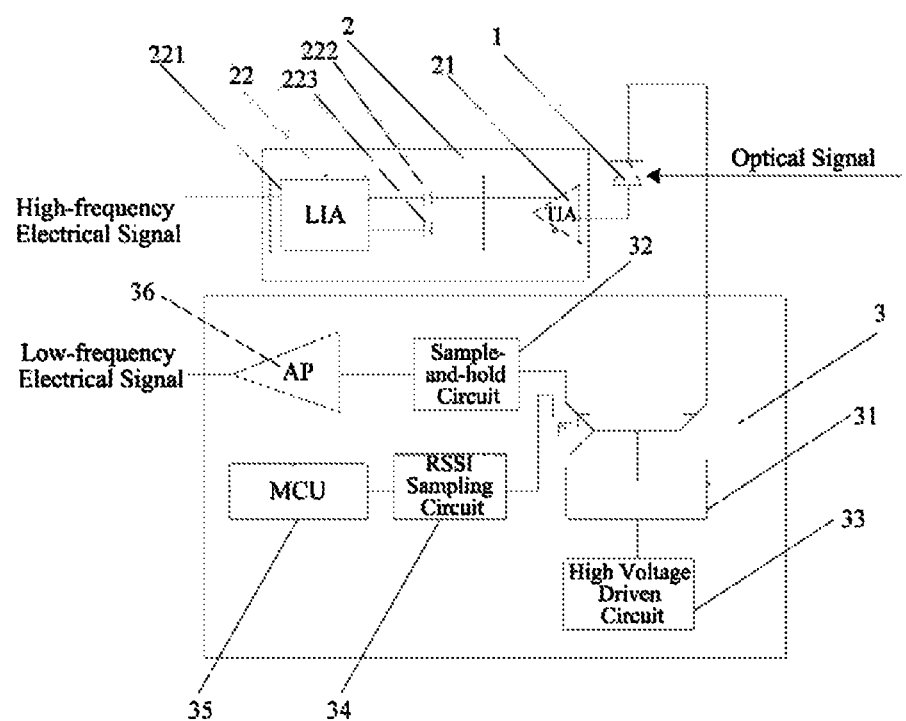
FIG. 4 is a structural diagram of yet another optical module according to some embodiments of the present application.

The high-pass filtering unit 22 may be embodied in several ways, among which one is shown as FIG. 4. FIG. 4 is a structural diagram of yet another optical module according to some embodiments of the present application. As shown in FIG. 4, the high-pass filter unit 22 includes a limiting amplifier (LIA) 221, a first capacitor 222, and a second capacitor 223.

The first capacitor 222 is connected to the transimpedance amplifier 21, while the second capacitor 223 is connected to the transimpedance amplifier 21.

The limiting amplifier 221 is connected to the first capacitor 222 and the second capacitor 223, respectively.

The transimpedance amplifier 21 outputs two differential signals. One end of the first capacitor 222 and one end of the second capacitor 223 are connected to the two differential signal outputs of the transimpedance amplifier 21, respectively, while the other end of the first capacitor 222 and the other end of the second capacitor 223 are connected to the input of the limiting amplifier 221.

The limiting amplifier 221 is configured to perform high-pass filtering on the voltage signal output by the transimpedance amplifier 21 along with the first capacitor 222 and the second capacitor 223.

The first capacitor 222, the second capacitor 223, and the pull-up resistor integrated in the limiting amplifier 221 constitute a high-pass filter, and when the voltage signal passes through the first capacitor 222, the second capacitor 223 and the limiting amplifier 221, the low-frequency signal within is filtered, thereby achieving high-pass filtering.

Optionally, the first capacitor 222 and the second capacitor 223 can be blocking capacitors, which are configured to remove the DC component in the signal output from the transimpedance amplifier 21, and the subsequent limiting amplifier 221 will further process the signal passed through the first capacitor 222 and the second capacitor 223.

The limiting amplifier 221 is further configured to limit-amplify and output the high-pass filtered voltage signal.

During the operation of the optical module, after the current signal output by the photoelectric conversion unit is received, the transimpedance amplifier converts the current signal into a voltage signal, meanwhile performs preliminary amplification on the voltage signal. Further, when the voltage signal passes through the first capacitor, the second capacitor, and the limiting amplifier, the low-frequency signal therein is filtered, thereby achieving high-pass filtering. Further, the limiting amplifier amplifies the signal according to the voltage signal after high-pass filtered, and the limiting amplifier further outputs the amplified signal to the afterward device, i.e., the system terminal described in FIG. 1, for use.

In some embodiments of the present application, the second demodulation circuit is in the following circuit structure. Reference is still made to FIG. 3 or FIG. 4, the second demodulation circuit 3 includes a current mirroring unit 31 and a sample-and-hold circuit 32.

In this case, the current mirroring unit 31 is connected to the photoelectric conversion unit 1.

The sample-and-hold circuit 32 is connected to the first output end of the current mirroring unit 31.

The current mirroring unit 31 is configured to receive a response current signal of the photoelectric conversion unit 1, perform low-pass filtering on the response current signal, and output a mirror current signal of the response current signal to the sample-and-hold circuit 32.

The sample-and-hold circuit 32 is configured to convert the received mirror current signal into a voltage signal.

In the embodiment of the present application, the current mirroring unit is connected to the photoelectric conversion unit. After the photoelectric conversion unit completes the photoelectric conversion and generates the current signal, the current mirroring unit can receive the response current signal of the photoelectric conversion unit, and perform low-pass filtering on the response current signal, so that the high-frequency signal in the response current signal is filtered. Further, the current mirroring unit outputs a mirror current signal of the low-pass filtered current signal which is further converted to a voltage by the sample-and-hold circuit and is output to a afterward device for use. After the processing by the current mirroring unit and the photoelectric conversion unit, the output signal is a low-frequency signal, such that bearing the low-frequency signal in the optical module is achieved.

Further, reference is still made to FIG. 3, the second demodulation circuit 3 further includes a high voltage driven circuit 33.

In this case, the high voltage driven circuit 33 is connected to the current mirroring unit 31.

The high voltage driven circuit 33 is configured to provide the photoelectric conversion unit 1 with a reverse high voltage through the current mirroring unit 31, so as to enable the photoelectric conversion unit 1 to generate a response current signal.

Further, reference is still made to FIG. 3, the second demodulation circuit 3 further includes: a Received Signal Strength Indication (RSSI) sampling circuit 34 and a Microcontroller Unit (MCU) 35.

In this case, one end of the RSSI sampling circuit 34 is connected to the second output end of the current mirroring unit 31, and the other end of the RSSI sampling circuit 34 is connected to the MCU 35.

The RSSI sampling circuit 34 is configured to monitor the mirror current signal output from the current mirroring unit 31 and send the monitoring result to the MCU 35.

After the current mirroring unit 31 generates a low-pass filtered mirror current signal, the mirror current signal will be output from the first output end and the second output end of the current mirroring unit 31, respectively. In this case, the mirror current signal output from the first output end is input to the foregoing sample-and-hold circuit, and in the embodiment of the present application, the mirror current signal output from the second output end will be input to the RSSI sampling circuit 34. The RSSI sampling circuit 34 can monitor the optical power of the optical signal received by the optical module by monitoring the mirror current signal, and the RSSI sampling circuit 34 reports the monitoring result to the MCU 35 for the subsequent analysis and processing by the MCU.

The high voltage driven circuit 33 can provide a reverse high voltage to the photoelectric conversion unit 1. The high voltage driven circuit 33 is connected to the current mirroring unit 31. In the processing of providing the reverse high voltage to the photoelectric conversion unit 1, noise is generated accordingly. Due to the use of the mirror current source and the fact that the input and the two outputs are independent from each other, the noise generated by the reverse high voltage can be reduced, and therefore the signal validity in the optical module is improved.

Based on some of the foregoing embodiments, in some optional embodiments, the foregoing current mirroring unit 31 can be a mirror current source with reference to FIG. 3.

In this case, the first input end of the mirror current source is connected to the high voltage driven circuit 33, the first output end of the mirror current source is connected to the sample-and-hold circuit 32, the second output end of the mirror current source is connected to the RSSI sampling circuit 34, and a third output end of the mirror current source is connected to the photoelectric conversion unit 1.

In this case, the first output end and the second output end of the mirror current source output a mirror image signal of the response current signal of the photoelectric conversion unit, which is received by the mirror current source, while the third output end of the mirror current source outputs a high voltage signal generated by a high voltage driven circuit. After the high voltage signal is input to the photoelectric conversion unit, the photoelectric conversion unit is enabled to operate and generate a response current signal.

In the process of operation, the mirror current source receives a reverse high voltage from the high voltage driven circuit 33 and outputs it to the photoelectric conversion unit 1, and further receives a response current signal of the photoelectric conversion unit. Since the mirror current source has the characteristic of being able to respond to a slow current, in case that the response current signal is a low-frequency electrical signal, the mirror current source can serve as a low-frequency device, i.e., the mirror current source can only process the low-frequency signal in the response current signal, therefore, the low-pass filtering is achieved only by the characteristic of the mirror current itself without adding an additional low-pass filtering device in the second demodulation circuit. After the mirror current source receives the response current signal, a low-frequency mirror current signal is output from the first output end and the second output end, and the subsequent two mirror current signal is respectively processed by the subsequent devices.

In some optional embodiments, reference is still made to FIG. 3, the second demodulation circuit 3 further includes an operational amplifier 36.

In this case, the operational amplifier 36 is connected to the sample-and-hold circuit 32.

The operational amplifier 36 is configured to amplify the voltage signal output from the sample-and-hold circuit 32.

As mentioned in the above, a low-frequency mirror current signal will be output by the mirror current source, and then be converted by the sample-and-hold circuit into a voltage signal whose value is generally small. If the voltage signal is directly used by the afterward device, then the resolution for the voltage signal by the afterward device will be affected. Therefore, in the embodiment of the present application, an operational amplifier is connected after the sample-and-hold circuit to amplify the voltage signal output from the sample-and-hold circuit, and the amplified voltage signal is output to the afterward device so as to ensure these voltage signals can be processed by the afterward device. Finally, it should be noted that the foregoing embodiments are merely intended for describing the technical solutions of the present application rather than limiting the present application. Although the present application is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present application.

What is claimed is:

1. An optical module, comprising: a photoelectric conversion unit, a first demodulation circuit, and a second demodulation circuit; wherein
   the first demodulation circuit and the second demodulation circuit are respectively connected to the photoelectric conversion unit;
   the photoelectric conversion unit is configured to convert a received optical signal into an electrical signal;
   the first demodulation circuit is configured to demodulate the electrical signal converted by the photoelectric conversion unit and generate a high-frequency electrical signal;
   the second demodulation circuit is configured to demodulate the electrical signal converted by the photoelectric conversion unit and generate a low-frequency electrical signal.

2. The optical module according to claim 1, wherein the first demodulation circuit comprises: a transimpedance amplifier and a high-pass filtering unit;
   the transimpedance amplifier is connected to the photoelectric conversion unit;
   the high-pass filtering unit is connected to the transimpedance amplifier;
   the transimpedance amplifier is configured to convert a current signal output from the photoelectric conversion unit into a voltage signal and output the voltage signal;
   the high-pass filtering unit is configured to perform high-pass filtering on the voltage signal output from the transimpedance amplifier.

3. The optical module according to claim 2, wherein the high-pass filtering unit comprises: a limiting amplifier, a first capacitor and a second capacitor;
   the first capacitor is connected to the transimpedance amplifier, and the second capacitor is connected to the transimpedance amplifier;
   the limiting amplifier is connected to the first capacitor and the second capacitor, respectively;
   the limiting amplifier is configured to perform high-pass filtering on the voltage signal output by the transimpedance amplifier along with the first capacitor and the second capacitor.

4. The optical module according to claim 1, wherein the second demodulation circuit comprises: a current mirroring unit and a sample-and-hold circuit;
   the current mirroring unit is connected to the photoelectric conversion unit;
   the sample-and-hold circuit is connected to a first output end of the current mirroring unit;
   the current mirroring unit is configured to receive a response current signal of the photoelectric conversion unit, perform low-pass filtering on the response current signal, and output a mirror current signal of the response current signal to the sample-and-hold circuit;
   the sample-and-hold circuit is configured to convert the received mirror current signal into a voltage signal.

5. The optical module according to claim 4, wherein the second demodulation circuit further comprises a high voltage driven circuit;
   the high voltage driven circuit is connected to the current mirroring unit;
   the high voltage driven circuit is configured to provide the photoelectric conversion unit with a reverse high voltage, so as to enable the photoelectric conversion unit to generate a response current signal.

6. The optical module according to claim 5, wherein the second demodulation circuit further comprises: a received signal strength indication (RSSI) sampling circuit and a micro processing unit (MCU);
   one end of the RSSI sampling circuit is connected to the current mirroring unit, and the other end of the RSSI sampling circuit is connected to the MCU;
   the RSSI sampling circuit is configured to monitor the mirror current signal output by the current mirroring unit and send a monitoring result to the MCU.

7. The optical module according to claim 6, wherein the current mirroring unit comprises a mirror current source;
   a first input end of the mirror current source is connected to the high voltage driven circuit;

a first output end of the mirror current source is connected to the sample-and-hold circuit;

a second output end of the mirror current source is connected to the RSSI sampling circuit;

a third output end of the mirror current source is connected to the photoelectric conversion unit.

8. The optical module according to claim 4, wherein the second demodulation circuit further comprises an operational amplifier;

the operational amplifier is connected to the sample-and-hold circuit;

the operational amplifier is configured to amplify the voltage signal output from the sample-and-hold circuit.

9. The optical module according to claim 5, wherein the second demodulation circuit further comprises an operational amplifier;

the operational amplifier is connected to the sample-and-hold circuit;

the operational amplifier is configured to amplify the voltage signal output from the sample-and-hold circuit.

10. The optical module according to claim 6, wherein the second demodulation circuit further comprises an operational amplifier;

the operational amplifier is connected to the sample-and-hold circuit;

the operational amplifier is configured to amplify the voltage signal output from the sample-and-hold circuit.

11. The optical module according to claim 7, wherein the second demodulation circuit further comprises an operational amplifier;

the operational amplifier is connected to the sample-and-hold circuit;

the operational amplifier is configured to amplify the voltage signal output from the sample-and-hold circuit.

12. The optical module according to claim 1, wherein the photoelectric conversion unit is an avalanche photo diode (APD) or a PIN photo diode.

13. The optical module according to claim 1, wherein the low-frequency electrical signal is a signal that supports the Auxiliary Management and Control Channel (AMCC) function.

* * * * *